(12) United States Patent
Kobayashi et al.

(10) Patent No.: US 12,267,613 B2
(45) Date of Patent: Apr. 1, 2025

(54) SIGNAL PROCESSING DEVICE

(71) Applicant: CANON KABUSHIKI KAISHA, Tokyo (JP)

(72) Inventors: Hideo Kobayashi, Tokyo (JP); Daisuke Yoshida, Kanagawa (JP); So Hasegawa, Kanagawa (JP); Yu Katase, Kanagawa (JP); Hajime Hayami, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 115 days.

(21) Appl. No.: 17/704,221

(22) Filed: Mar. 25, 2022

(65) Prior Publication Data

US 2022/0321820 A1 Oct. 6, 2022

(30) Foreign Application Priority Data

Apr. 1, 2021 (JP) ................... 2021-062604

(51) Int. Cl.
*H04N 25/79* (2023.01)
*G06T 7/50* (2017.01)

(52) U.S. Cl.
CPC .............. *H04N 25/79* (2023.01); *G06T 7/50* (2017.01)

(58) Field of Classification Search
CPC ......... H04N 25/79; G06T 7/50; G01S 7/4863; H01L 27/14609
See application file for complete search history.

(56) References Cited

U.S. PATENT DOCUMENTS

| | | | |
|---|---|---|---|
| 7,952,409 B2 | 5/2011 | Yoshida | |
| 8,237,480 B2 | 8/2012 | Yoshida | |
| 9,093,363 B2 * | 7/2015 | Sukegawa | ......... H01L 27/14636 |
| 9,270,905 B2 | 2/2016 | Ogura et al. | |
| 9,635,298 B2 | 4/2017 | Nakamura et al. | |
| 9,947,615 B2 | 4/2018 | Kobayashi et al. | |
| 10,504,831 B2 | 12/2019 | Kobayashi et al. | |
| 10,831,235 B2 | 11/2020 | Katase et al. | |
| 11,140,348 B2 | 10/2021 | Totsuka et al. | |

(Continued)

FOREIGN PATENT DOCUMENTS

| | | |
|---|---|---|
| JP | 2011-159958 A | 8/2011 |
| JP | 2011-181595 A | 9/2011 |

(Continued)

OTHER PUBLICATIONS

U.S. Appl. No. 17/769,598, filed Apr. 15, 2022, by Kohichi Nakamura, et al.

(Continued)

*Primary Examiner* — Michael E Teitelbaum
(74) *Attorney, Agent, or Firm* — VENABLE LLP

(57) ABSTRACT

Provided is a signal processing device including a first substrate, a signal generation circuit arranged in the first substrate and configured to generate a reference signal to be used for comparison with a signal output from a pixel, a circuit element arranged in the first substrate and different from the signal generation circuit, and a contact region in which a contact connecting the first substrate and a wiring layer arranged over the first substrate is arranged. In a plan view with respect to the first substrate, the contact region is arranged between the signal generation circuit and the circuit element.

23 Claims, 15 Drawing Sheets

(56) References Cited

U.S. PATENT DOCUMENTS

| | | |
|---|---|---|
| 2012/0314109 A1 | 12/2012 | Murakami et al. |
| 2013/0026343 A1 | 1/2013 | Saito et al. |
| 2014/0240565 A1 | 8/2014 | Murakami |
| 2014/0313385 A1* | 10/2014 | Sato ............ H04N 25/745 348/302 |
| 2020/0402872 A1 | 12/2020 | Katase |
| 2021/0029316 A1* | 1/2021 | Lee ............ H04N 25/40 |
| 2021/0176458 A1* | 6/2021 | Inada ............ H04N 25/79 |
| 2021/0266484 A1 | 8/2021 | Kobayashi et al. |
| 2021/0266485 A1 | 8/2021 | Kobayashi et al. |

FOREIGN PATENT DOCUMENTS

| | | |
|---|---|---|
| JP | 2013-30997 A | 2/2013 |
| JP | 2014-165396 A | 9/2014 |
| JP | 2017-55099 A | 3/2017 |
| JP | 2021-34493 A | 3/2021 |
| WO | 2019/244514 A | 12/2019 |

OTHER PUBLICATIONS

Japanese Office Action issued Nov. 30, 2022 during prosecution of related Japanese application No. 2021-062604 (English-language machine translation included.).

Japanese Office Action issued Apr. 16, 2024 during prosecution of related Japanese application No. JP 2021-062604 (English-Language machine translation included).

* cited by examiner

FIG. 13
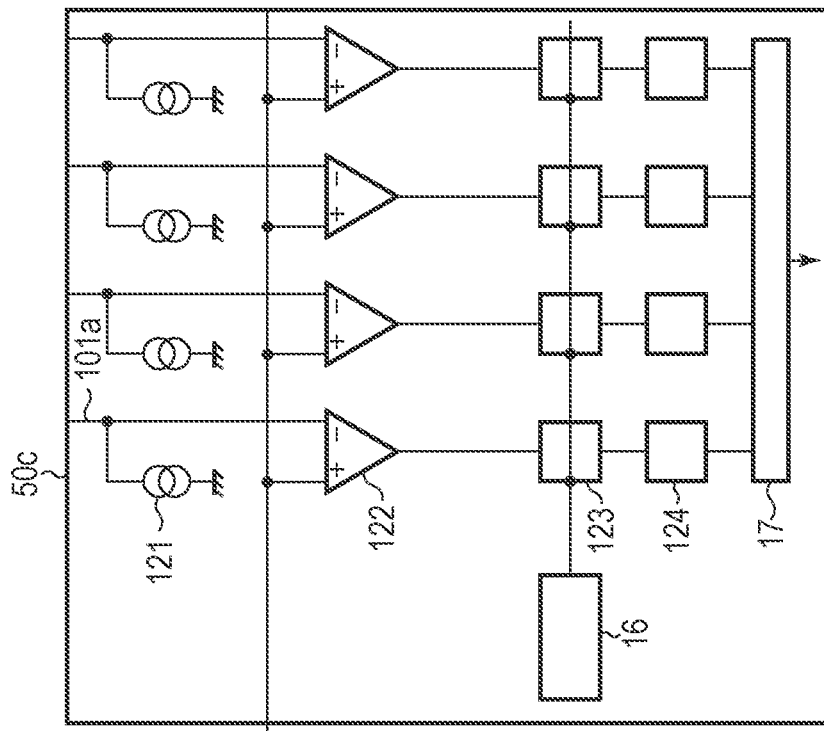
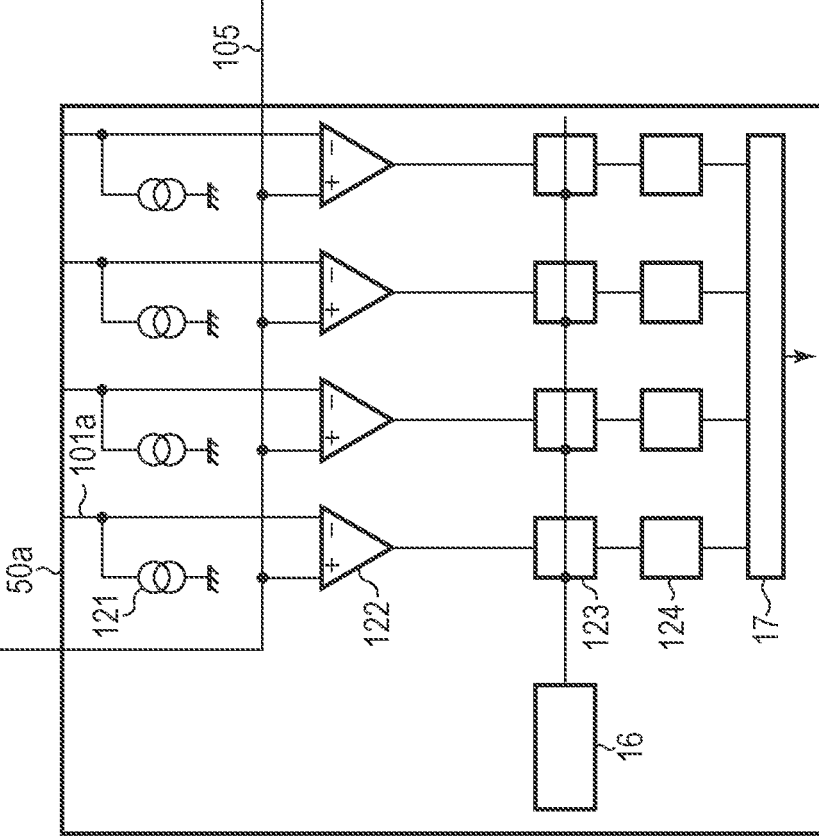

SIGNAL PROCESSING DEVICE

BACKGROUND OF THE INVENTION

Field of the Invention

The present invention relates to a signal processing device.

Description of the Related Art

Japanese Patent Application Laid-Open No. 2013-30997 discloses a solid-state imaging device including a signal generation circuit that generates a reference signal used for analog-to-digital conversion.

However, the signal generation circuit described in Japanese Patent Application Laid-Open No. 2013-30997 generates heat due to power consumption. The heat generated in the signal generation circuit may affect the quality of the output signal.

SUMMARY OF THE INVENTION

The present invention intends to provide a signal processing device capable of improving the quality of an output signal.

According to an aspect of the present invention, there is provided a signal processing device including a first substrate, a signal generation circuit arranged in the first substrate and configured to generate a reference signal to be used for comparison with a signal output from a pixel; a circuit element arranged in the first substrate and different from the signal generation circuit, and a contact region in which a contact connecting the first substrate and a wiring layer arranged over the first substrate is arranged. In a plan view with respect to the first substrate, the contact region is arranged between the signal generation circuit and the circuit element.

Further features of the present invention will become apparent from the following description of exemplary embodiments with reference to the attached drawings.

BRIEF DESCRIPTION OF THE DRAWINGS

FIG. 13 is a diagram for explaining a configuration of a signal processing circuit according to the second embodiment.

DESCRIPTION OF THE EMBODIMENTS

Preferred embodiments of the present invention will now be described in detail in accordance with the accompanying drawings. Throughout the drawings, the same elements or corresponding elements are labeled with common references, and the description thereof may be omitted or simplified.

First Embodiment

Figure 1:
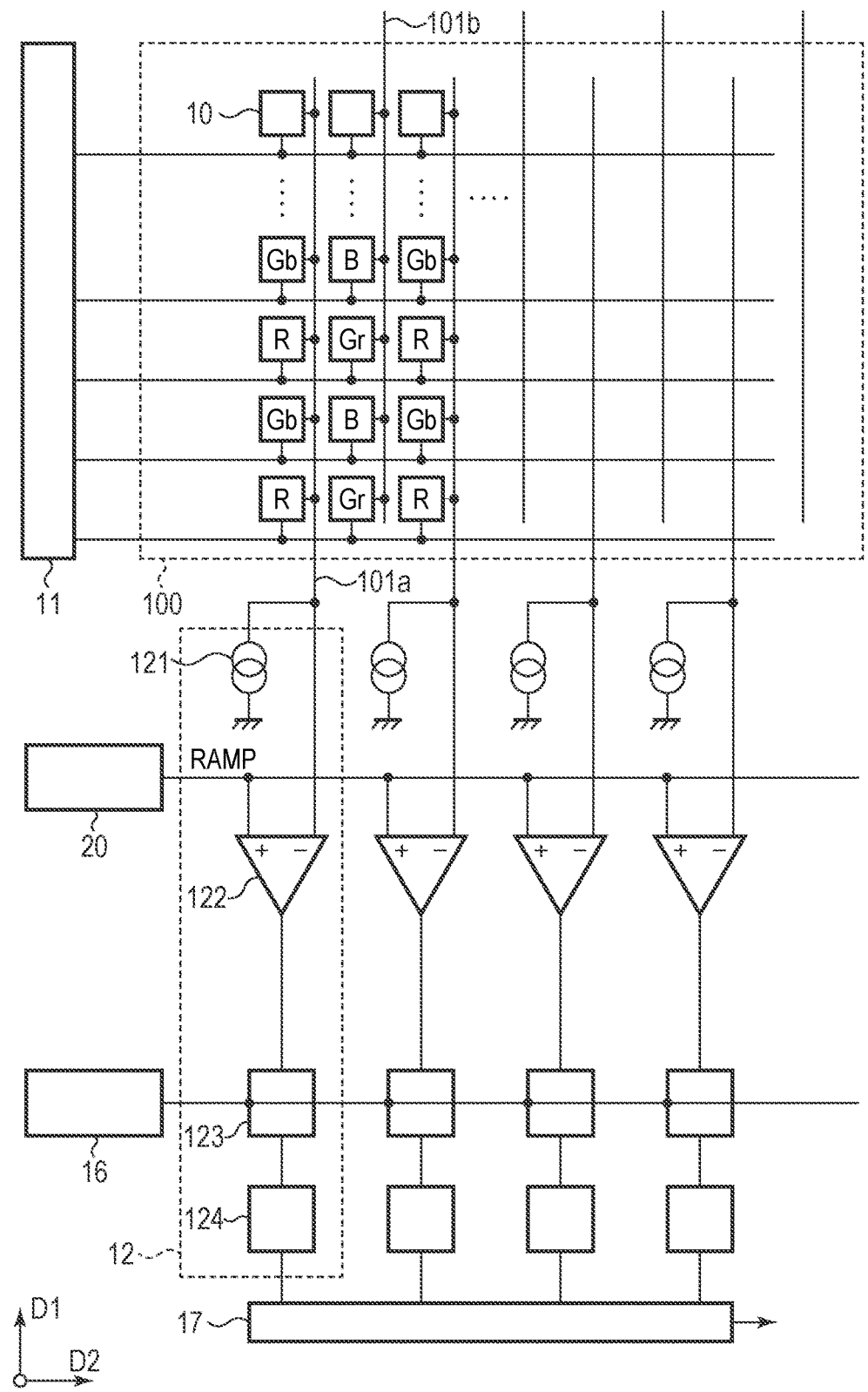
FIG. 1 is a block diagram of a photoelectric conversion device according to a first embodiment.

FIG. 1 is a block diagram of a photoelectric conversion device according to the present embodiment. The photoelectric conversion device includes a pixel array 100, a vertical scanning circuit 11, a column circuit 12, a reference signal generation circuit 20, a counter 16, and an output circuit 17. These circuits are formed in a semiconductor substrate. Note that the photoelectric conversion device of the present embodiment is assumed to be an imaging device that acquires an image, but the photoelectric conversion device is not limited to this. For example, the photoelectric conversion device may be a focus detection device, a distance measuring device, a time-of-flight (TOF) camera, or the like.

The pixel array 100 includes a plurality of pixels 10 arranged in a plurality of rows and a plurality of columns and outputting pixel signals corresponding to incident light. Each of the plurality of pixels 10 includes a photoelectric conversion unit that generates and accumulates signal charges based on incident light. In this specification, the first direction D1 indicates a vertical direction in FIG. 1, and the second direction D2 indicates a horizontal direction intersecting the first direction D1 in FIG. 1. FIG. 1 illustrates pixels 10 in n rows and m columns of rows R1 to Rn and columns C1 to Cm. A microlens and a color filter may be disposed on the pixel 10. The color filter is, for example, one of primary color filters of red (R), blue (B), and green (Gr, Gb), and is provided on each pixel 10 in a Bayer array.

The pixel array 100 includes an aperture pixel region and a light-shielded pixel region in which a light-shielding film is formed. A light shielding film is not formed in the pixel 10 included in the aperture pixel region, and a pixel signal corresponding to incident light can be output. The light-shielded pixel region is a horizontal optical black (HOB) pixel region arranged adjacent to the aperture pixel region along the second direction D2. A dark signal corresponding to a noise component is output from the pixel 10 in the light-shielded pixel region.

The pixel array 100 may include a distance measuring row in which focus detection pixels for outputting pixel signals for focus detection are arranged, and a plurality of imaging rows in which imaging pixels for outputting pixel signals for generating images are arranged. A plurality of pixels 10 connected to a column signal line 101a and a plurality of pixels 10 connected to a column signal line 101b are arranged in two different columns. That is, the column signal lines 101a and 101b are connected to respective columns of the plurality of pixels 10, and the plurality of pixels 10 in the same column sequentially output pixel signals to the common column signal line 101a or 101b.

The column signal line 101a or 101b is provided for each column of the pixels 10, and the pixels 10 in the same column output pixel signals to the common column signal line 101a or 101b. In the present embodiment, the odd-numbered column signal lines 101a and the even-numbered column signal lines 101b may be connected to different circuits. That is, the pixels 10 in odd-numbered columns are read by the column circuits 12 via the column signal lines 101a, and the pixels 10 in even-numbered columns are read by the column circuits 12 via the column signal lines 101b. The number of column signal lines arranged in one column of pixels 10 is not limited to one, and may be plural such as two to twenty four. Although four columns of column circuits 12 are illustrated in FIG. 1, a larger number of column circuits 12 are actually arranged. Typically, the number of columns of the column circuit 12 is several hundreds to several thousands.

The vertical scanning circuit 11 includes a shift register, a gate circuit, a buffer circuit, and the like. The vertical scanning circuit 11 outputs control signals to the pixels 10 based on a vertical synchronization signal, a horizontal synchronization signal, a clock signal, and the like, and drives the pixels 10 in a row basis.

The column circuit 12 is connected to the column signal line 101a or 101b, and processes pixel signals output from the pixels 10. Specifically, the column circuit 12 amplifies pixel signals on the column signal line 101a or 101b, and performs analog-to-digital (AD) conversion. The column circuit 12 may include a current source 121 connected to the column signal line 101a or 101b, a comparator 122 for comparing a reference signal with a pixel signal, a first memory 123, a second memory 124, and the like for holding a count signal according to a comparison result of the comparator. The current source 121 is connected to the column signal line 101a or 101b, and functions as a load circuit for supplying a driving current for outputting signals from the pixel 10.

The comparator 122 includes a differential amplifier circuit and the like, and has an inverting input node, a non-inverting input node, and an output node. A pixel signal may be input to the inverting input node, and a reference signal RAMP may be input to the non-inverting input node. The comparator 122 compares the reference signal RAMP with the pixel signal, and outputs a comparison signal representing the comparison result from the output node.

The reference signal generation circuit 20 generates a reference signal (ramp signal) RAMP whose voltage changes depending on time, based on a clock pulse output from a clock generation circuit (not illustrated). The reference signal generation circuit 20 may be configured using various methods such as a capacitance charging/discharging method, a DAC method, and a current steering method. The reference signal RAMP may be an up slope in which the voltage rises with time or a down slope in which the voltage falls with time. The reference signal RAMP may include a plurality of slope waveforms having different voltage change rates per unit time.

The counter 16 counts the clock pulse output from a clock generation circuit (not illustrated), and performs count-up or count-down of a count signal which is a digital signal having a predetermined number of bits. The clock generation circuit includes an oscillation circuit and the like, and supplies the clock pulse to the counter 16. The counter 16 starts counting the clock pulse simultaneously with the start of the voltage change of the reference signal RAMP of the reference signal generation circuit 20, and outputs the clock signal to the first memory 123 via a wiring.

The comparison signal from the comparator 122 and the count value from the counter 16 are input to the first memory 123. The first memory 123 latches the count signal at the timing when the comparison result is inverted. The count signal held in the first memory 123 represents a digital value obtained by analog-to-digital conversion of the pixel signal. The second memory 124 can hold the count value transferred from the first memory 123. Each of the first memory 123 and the second memory 124 may hold a count signal at the time of resetting the pixel 10 and a count signal based on photoelectric conversion at the pixel 10.

The output circuit 17 may include a horizontal scanning circuit and a signal processing circuit. The horizontal scanning circuit includes a decoder or a shift register. The horizontal scanning circuit sequentially outputs count signals held in the second memory 124 to the signal processing circuit. The signal processing circuit includes a digital signal processor and performs digital signal processing such as digital gain, digital correlated double sampling, digital offset, and linearity correction. The signal processing circuit includes a serial output circuit of the low voltage differential signaling (LVDS) system, and outputs the digital signal subjected to the signal processing to the outside of the photoelectric conversion device at high speed and low power consumption.

FIG. 1 illustrates an example in which a count signal is input to the plurality of first memories 123 from the common counter 16, but it is not limited thereto. For example, a plurality of counters 16 may be arranged to correspond to the plurality of first memories 123, respectively. In this case, a common clock pulse can be input to the plurality of counters 16 from the clock generation circuit.

In FIG. 1, only those corresponding to the column signal lines 101a are illustrated as the column circuit 12, the reference signal generation circuit 20, the counter 16, and the output circuit 17, and those corresponding to the column signal lines 101b are not illustrated. The column circuit 12, the reference signal generation circuit 20, the counter 16, and the output circuit 17 corresponding to the column signal lines 101b may have the same configuration as those corresponding to the column signal lines 101a as illustrated in FIG. 1.

Figure 2:
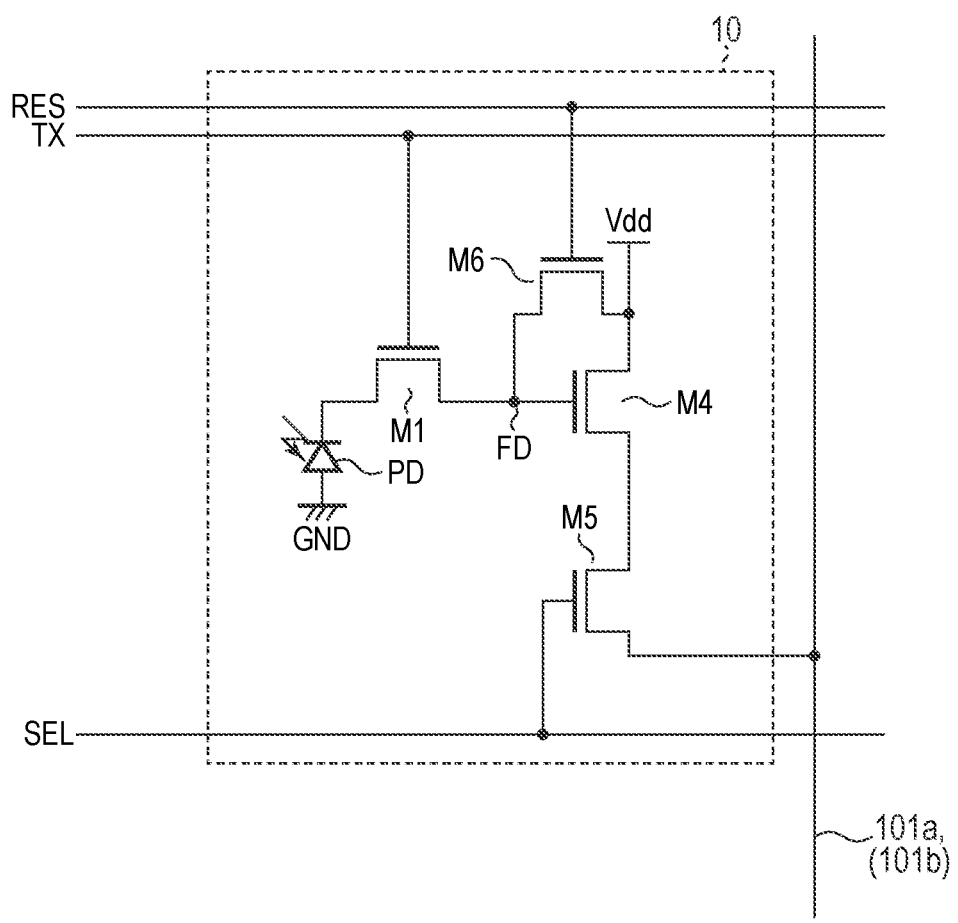
FIG. 2 is an equivalent circuit diagram of a pixel according to the first embodiment.

FIG. 2 is an equivalent circuit diagram of the pixel 10 according to the present embodiment. The pixel 10 may include a photoelectric conversion unit PD, a transfer transistor M1, a floating diffusion FD, a source follower transistor M4, a select transistor M5, and a reset transistor M6. In the following description, unless otherwise specified, these transistors are configured by N-type metal-oxide-semiconductor (MOS) transistors. A reference voltage (for example, ground voltage GND) is supplied to back gate nodes (not illustrated) of these transistors. The drain nodes of the reset transistor M6 and the source follower transistor M4 are connected to the power supply voltage Vdd. A P-type MOS transistor may be used instead of the N-type MOS transistor. In this case, the voltage of the control signal applied to the gate node of the P-type MOS transistor is inverted with respect to the voltage of the control signal applied to the gate node of the N-type MOS transistor.

The photoelectric conversion unit PD is, for example, a photodiode, and generates charges by photoelectric conversion of incident light and accumulates the generated charges. Instead of the photodiode, a photoelectric conversion film of an organic material, a photogate, or the like may be used to generate a photoelectric effect. The photoelectric conversion unit PD is provided with a microlens, and light condensed by the microlens enters the photoelectric conversion unit PD. The number of photoelectric conversion units PD included in one pixel 10 is not limited. For example, two, four, or more photoelectric conversion units PD may be provided to share one microlens. Thus, a signal for distance measurement used for phase difference autofocus or the like can be acquired. Further, dark current noise can be reduced by adopting a buried photodiode for the photoelectric conversion unit PD.

The transfer transistor M1 is provided corresponding to the photoelectric conversion unit PD, and a control signal TX is supplied to the gate node of the transfer transistor M1. When the control signal TX becomes the high level, charges generated by light reception and accumulated in the photoelectric conversion unit PD are transferred to the floating diffusion FD via the transfer transistor M1.

A power supply voltage Vdd is applied to the drain node of the source follower transistor M4. The source potential of the source follower transistor M4 changes according to the amount of charge transferred to the floating diffusion FD.

The select transistor M5 is provided between the source follower transistor M4 and the column signal line 101a (101b). The select transistors M5 of the pixels 10 in a plurality of rows in the same column are connected to a common column signal line 101a (101b). The current source 121 and the source follower transistor M4 constitute a source follower. A control signal SEL is supplied to the gate node of the select transistor M5. When the control signal SEL becomes the high level, the select transistor M5 outputs a signal corresponding to the source potential of the source follower transistor M4 to the column signal line 101a.

The source node of the reset transistor M6 is connected to the floating diffusion FD, and the power supply voltage Vdd is applied to the drain node of the reset transistor M6. A control signal RES is supplied to the gate node of the reset transistor M6. When the control signal RES becomes the high level, the reset transistor M6 resets the potential of the floating diffusion FD.

Figure 3:
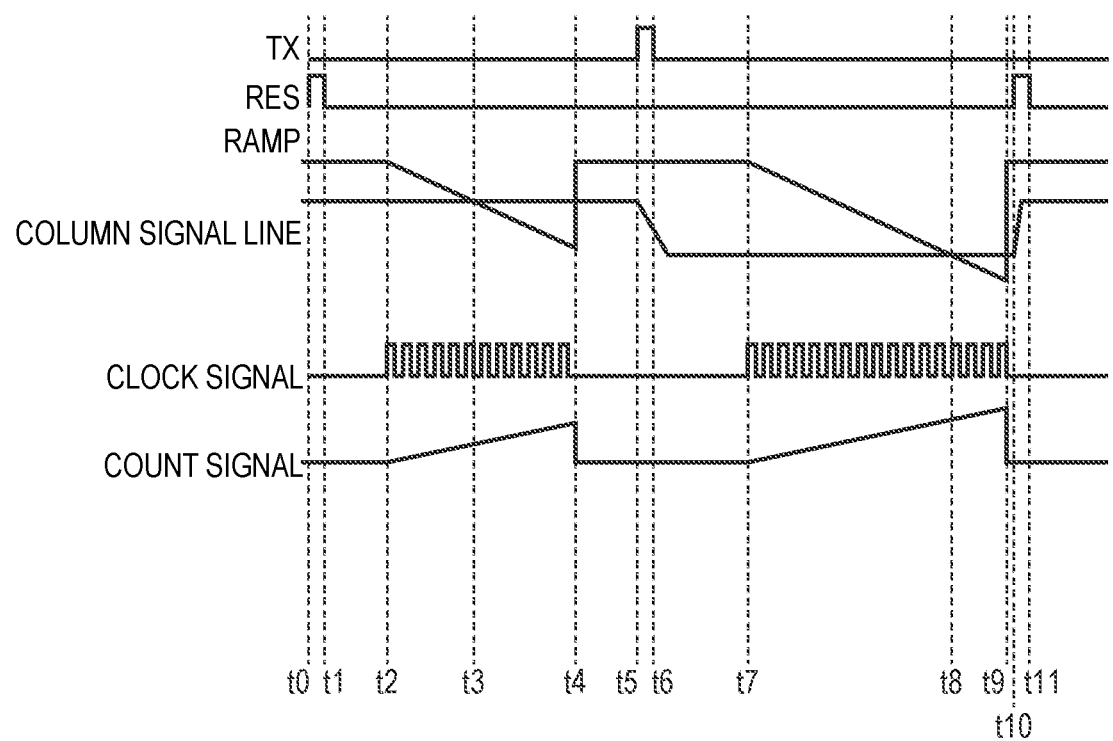
FIG. 3 is a timing chart illustrating the operation of the photoelectric conversion device according to the first embodiment.

FIG. 3 is a timing chart illustrating the operation of the photoelectric conversion device according to the present embodiment. FIG. 3 illustrates temporal changes of the control signals TX and RES, the reference signal RAMP, the potential of the column signal line 101a (101b), the clock signal supplied to the counter 16, and the count signal output from the counter 16. In the period illustrated in FIG. 3, the control signal SEL of a certain row of the plurality of rows is at the high level, and the select transistor M5 of the pixel 10 arranged in the row is turned on. Hereinafter, the operation of the row in which the control signal SEL is at the high level will be described.

At time t0, the control signal TX is at the low level, and the transfer transistor M1 is turned off. The clock generation circuit stops outputting the clock pulse, and the counter 16 does not receive the clock pulse. That is, the count signal is an initial value at time t0. At this time, the reference signal RAMP is also an initial value.

At time t0 to t1, the control signal RES becomes the high level and the reset transistor M6 is turned on, thereby resetting the floating diffusion FD. At this time, the select transistor M5 is turned on, and the potential of the column signal line 101a (101b) becomes a reset level corresponding to the potential of the floating diffusion FD. At time t1, the control signal RES transits from the high level to the low level, the reset transistor M6 is turned off, and the reset of the floating diffusion FD ends.

At time t2, the reference signal generation circuit 20 starts the slope operation of the reference signal RAMP. That is, the potential of the reference signal RAMP decreases with time. The clock generation circuit starts outputting the clock pulse to the counter 16, and the counter 16 starts counting the clock pulse.

At time t3, the magnitude relation between the pixel signal on the column signal line 101a (101b) and the reference signal RAMP is inverted, and the level of the comparison signal at the output node of the comparator 122 is inverted. The first memory 123 holds the count value of the counter 16 in response to the inversion of the comparison signal. Thus, the pixel signal at the time of resetting the pixel 10 is converted into a digital signal.

At time t4, the reference signal RAMP is reset, and the count value of the counter 16 is also reset. At time t5 to t6, the control signal TX becomes the high level, and the transfer transistor M1 is turned on. The charge accumulated in the photoelectric conversion unit PD is transferred to the floating diffusion FD via the transfer transistor M1, and the potential of the floating diffusion FD decreases in accordance with the transferred charges. The source follower transistor M4 outputs a voltage corresponding to the potential of the floating diffusion FD to the column signal line 101a (101b) via the select transistor M5. As a result, a signal (detection signal) corresponding to the charge at the time of photoelectric conversion is output to the column signal line 101a (101b).

At time t7, the reference signal generation circuit 20 starts the slope operation of the reference signal RAMP. Further, the clock generation circuit starts outputting the clock pulse to the counter 16, and the counter 16 starts counting the clock pulse.

At time t8, the magnitude relation between the pixel signal on the column signal line 101a (101b) and the reference signal RAMP is inverted, and the level of the comparison signal at the output node of the comparator 122 is inverted. The first memory 123 holds the count value of the counter 16 in response to the inversion of the comparison signal. Thus, the pixel signal based on the photoelectric conversion of the pixel 10 is converted into a digital signal.

At time t9, the reference signal RAMP is reset, and the count value of the counter 16 is also reset. At time t10 to t11, the control signal RES becomes the high level again, and the reset transistor M6 is turned on, whereby the floating diffusion FD is reset. Similarly, the column circuit 12 reads the pixel signal from the pixel 10 and performs analog-to-digital conversion of the pixel signal.

Figure 4:
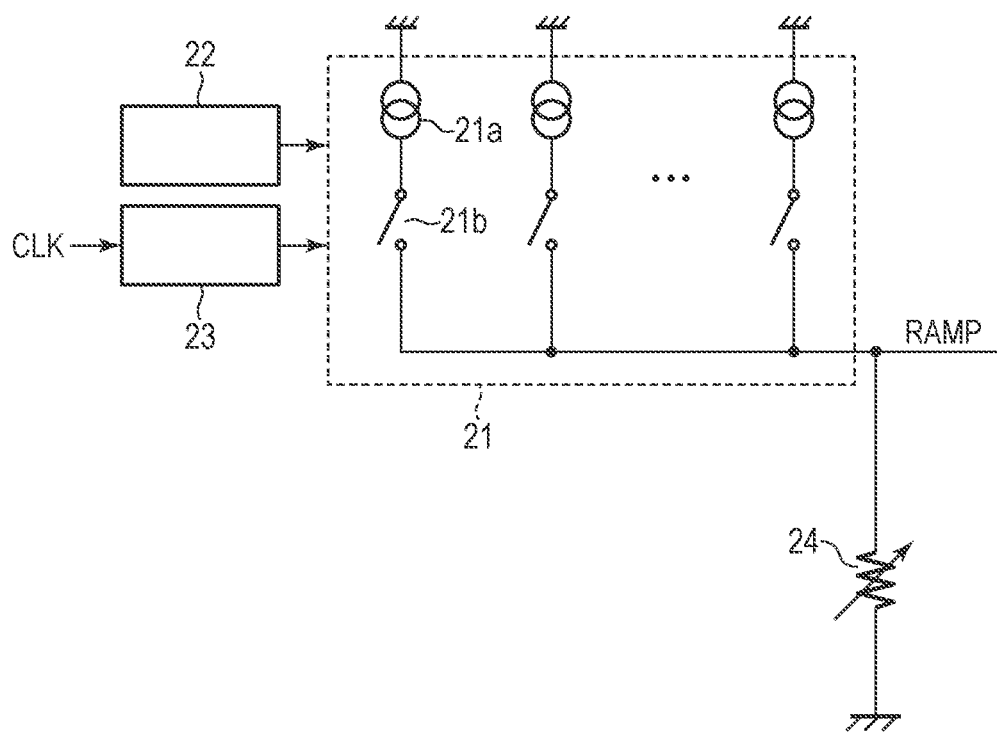
FIG. 4 is a block diagram of a reference signal generation circuit according to the first embodiment.

Next, the configuration of the reference signal generation circuit 20 and its surrounding elements will be described. FIG. 4 is a block diagram of the reference signal generation circuit 20 according to the present embodiment. As illustrated in FIG. 3, the reference signal generation circuit 20 generates a ramp signal whose potential changes with time. The reference signal generation circuit 20 includes a digital-to-analog (DA) conversion circuit 21, a bias circuit 22, a counter 23, and a variable resistor 24. The DA conversion circuit 21 includes a plurality of current sources 21a and a plurality of switches 21b. Each of the plurality of current sources 21a is connected to an output node of the reference signal generation circuit 20 via a corresponding switch 21b. The variable resistor 24 is arranged between the output node of the reference signal generation circuit 20 and a power supply line for supplying a ground potential.

The bias circuit 22 supplies a bias voltage to the current sources 21a. A clock pulse CLK is input to the counter 23 from a clock generation circuit. The counter 23 counts the clock pulse CLK and outputs the count value to the DA conversion circuit 21. The DA conversion circuit 21 controls each of the plurality of switches 21b to be turned on or off in accordance with the count value. More specifically, in an initial state (for example, time t2 in FIG. 3), all the switches 21b are controlled to be turned on, and thereafter, part of the switches 21b is controlled to be turned off sequentially in accordance with an increase in the count value. Since the amount of current flowing through the variable resistor 24 decreases with time, the amount of voltage drop in the variable resistor 24 decreases with time. Accordingly, the potential of the output node decreases as time elapses. In this way, the reference signal generation circuit 20 can generate a ramp signal whose potential changes with time.

Figure 5:
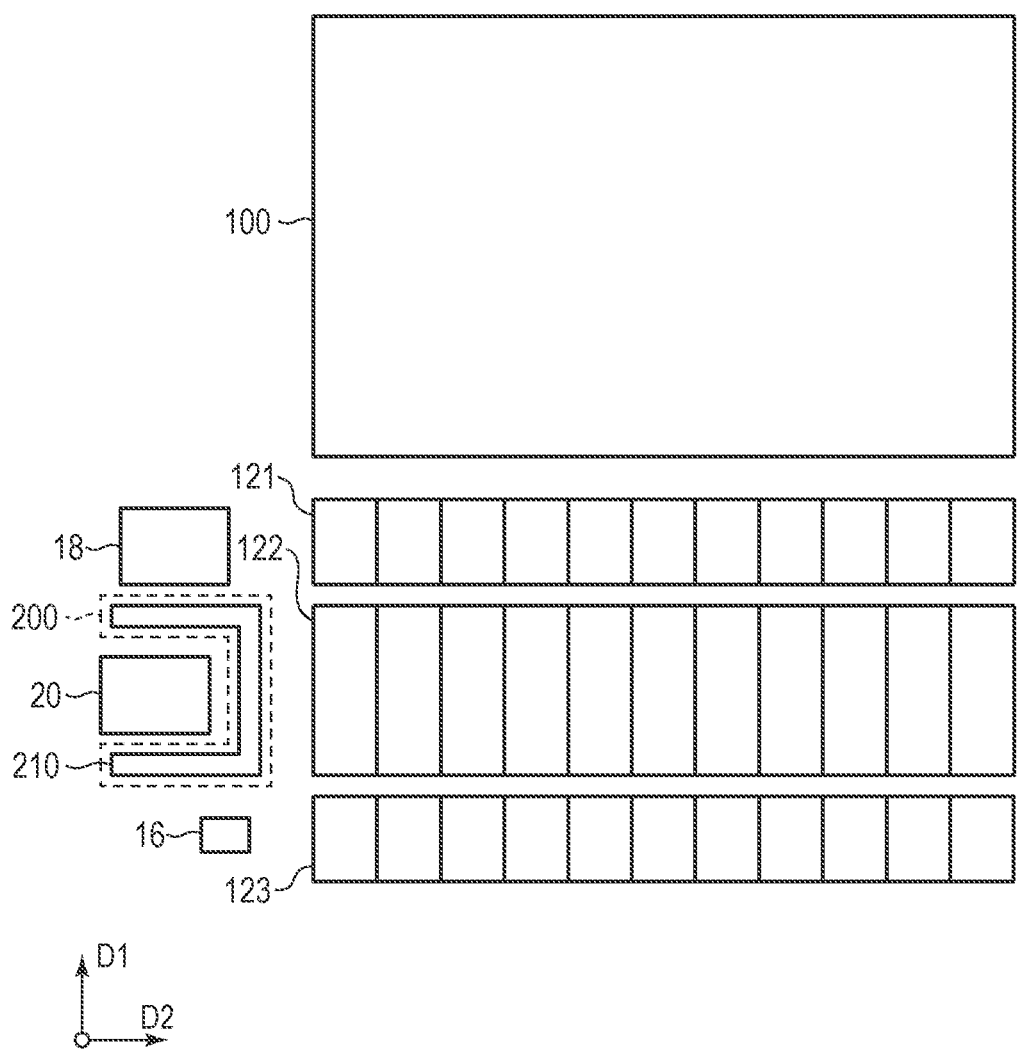
FIG. 5 is a schematic diagram illustrating a configuration around a reference signal generation circuit in the photoelectric conversion device according to the first embodiment.

FIG. 5 is a schematic diagram illustrating a configuration around the reference signal generation circuit 20 in the photoelectric conversion device according to the present embodiment. FIG. 5 schematically illustrates the arrangement of the pixel array 100, the current sources 121, the comparators 122, the first memories 123, the reference signal generation circuit 20, and the counter 16 described in the description of FIG. 1. Also, FIG. 5 schematically illustrates the arrangement of a bias circuit 18, a well region 200, and a well contact region 210.

The bias circuit 18 supplies a bias voltage to the current source 121. The well region 200 schematically illustrates a region in which a well is arranged in the semiconductor substrate in which the photoelectric conversion device is formed. The well contact region 210 schematically illustrates a region in which a well contact is formed in the well region 200. The well contact is a conductive member that electrically connects a well in the semiconductor substrate to a wiring layer arranged over the semiconductor substrate.

The well region 200 and the well contact region 210 are arranged so as to surround three sides of the reference signal generation circuit 20 in a plan view with respect to the semiconductor substrate. That is, in a plan view with respect to the semiconductor substrate, the well contact in the well contact region 210 is arranged between the reference signal generation circuit 20 and circuit elements other than that. The circuit elements other than the reference signal generation circuit 20 may be, for example, the comparator 122, the bias circuit 18, and the counter 16.

The reference signal generation circuit 20 has, for example, a circuit configuration involving power consumption as illustrated in FIG. 4. Therefore, the reference signal generation circuit 20 generates heat by consuming power when generating the reference signal. Since this heat increases the temperature of the members in the vicinity of the reference signal generation circuit 20, the characteristics of the circuit elements arranged in the vicinity of the reference signal generation circuit 20 may vary.

Examples of characteristic variation will be described. For example, when the temperature of the comparator 122 rises, the accuracy of AD conversion by the comparator 122 may change depending on the temperature. As in the circuit of FIG. 1, when a plurality of comparators 122 are arranged for respective columns, the comparator 122 in the column closer to the reference signal generation circuit 20 and the comparator 122 in the column farther from the reference signal generation circuit 20 have different temperatures. Therefore, the accuracy of the digital value of the output signal may differ depending on the positions of the comparators 122. In this way, shading may occur in the output image due to the temperature gradient caused by the heat generated by the reference signal generation circuit 20. When the temperature of the bias circuit 18 rises, the bias voltage may change and this affects the driving current supplied by the current source 121. When the temperature of the counter 16 rises, the time accuracy such as the cycle of the pulses of the count signal may be affected. Thus, the heat generated by the reference signal generation circuit 20 affects the signal processing in the column circuit 12, so that the quality of the output signal may be degraded.

Thus, in this embodiment, as illustrated in FIG. 5, a well contact region 210 is arranged between the reference signal generation circuit 20 and a circuit element different from the reference signal generation circuit 20. By arranging the well contact in the well contact region 210, the heat generated by the reference signal generation circuit 20 flows to the well contact. This improves heat dissipation and reduces temperature rise of the circuit elements in the vicinity of the reference signal generation circuit 20. Therefore, the influence of heat due to the above factors is reduced, and the quality of the output signal is improved.

A conductive member made of a metal such as aluminum, copper, or tungsten is preferably used for the well contact or the wiring layer. These conductive members have a higher thermal conductivity and a greater effect of improving heat dissipation than a semiconductor substrate material such as silicon, thereby further improving the quality of an output signal.

Figure 6:
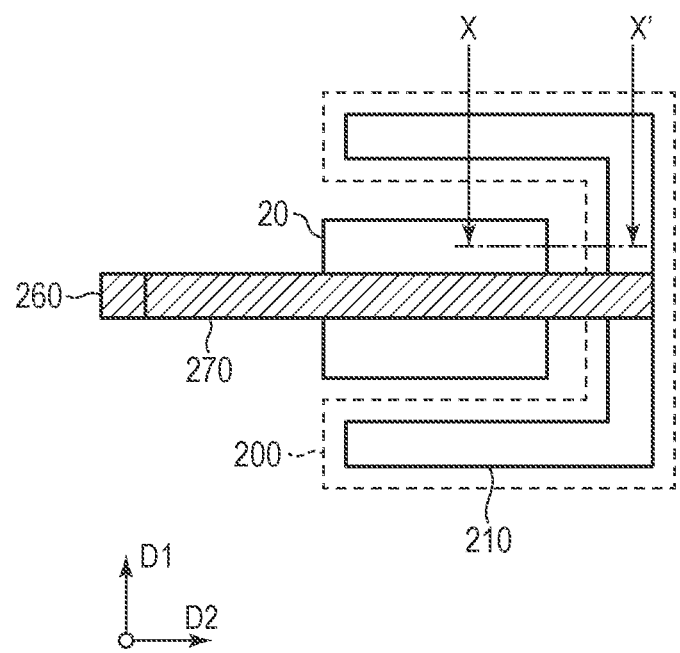
FIG. 6 is a schematic diagram illustrating supply of a power supply potential to a well contact region according to the first embodiment.

The configuration of the well contact region 210 and the configuration around the well contact region 210 will be described in more detail. FIG. 6 is a schematic diagram illustrating supply of a power supply potential to the well contact region 210 according to the present embodiment. FIG. 6 further illustrates a bonding pad 260 and a power supply wiring 270. As illustrated in FIG. 6, a power supply wiring 270 is connected to the well contact region 210 via a well contact. The power supply wiring 270 extends in the second direction D2 toward the bonding pad 260. The bonding pad 260 is an external terminal connected to the outside of the photoelectric conversion device by a mounting member such as a bonding wire.

Figure 7:
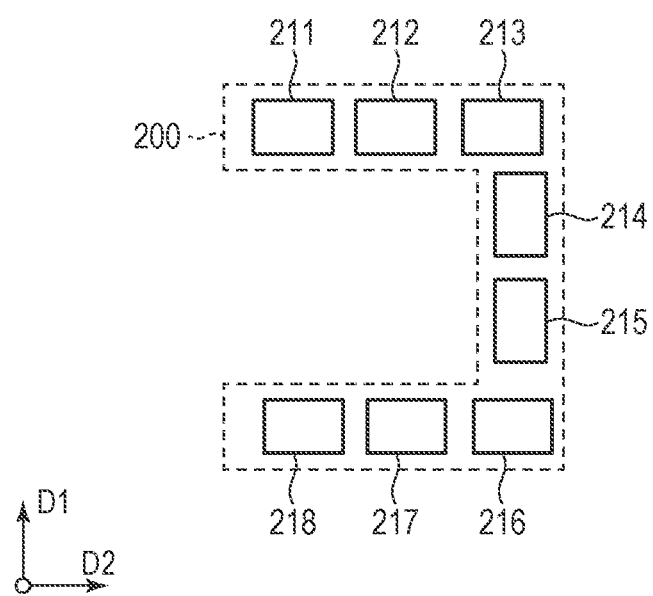
FIG. 7 is a schematic diagram illustrating a modification of the well contact region according to the first embodiment.
Figure 8:
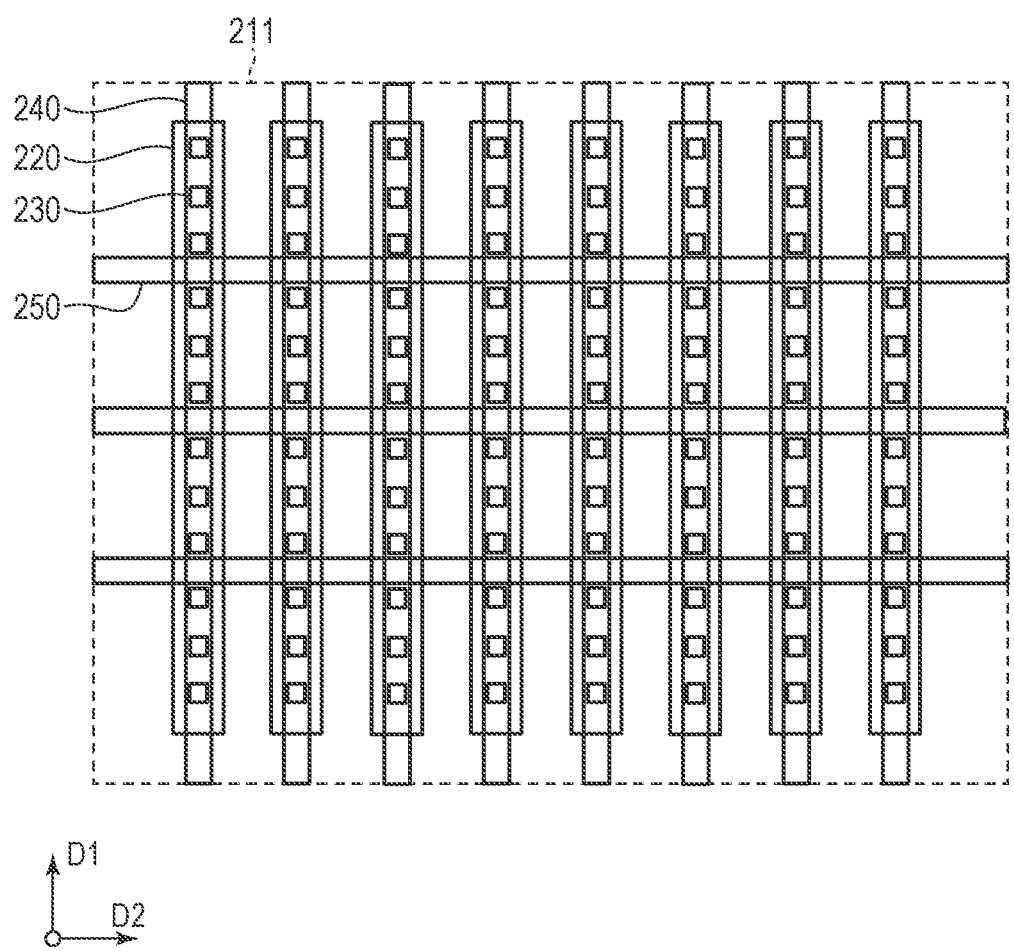
FIG. 8 is a schematic diagram illustrating a modification of the well contact region according to the first embodiment.

FIGS. 7 and 8 are schematic diagrams illustrating a modification of the well contact region according to the present embodiment. In FIG. 7, the well contact region 210 in FIG. 5 is divided into a plurality of well contact regions 211 to 218. A well contact is formed in each of the well contact regions 211 to 218. Thus, a plurality of well contact regions may be provided. Thus, the wiring can be easily passed through the gap between the well contact regions, and the degree of freedom in design is improved.

FIG. 8 is a schematic diagram illustrating a more detailed configuration of the well contact region 211 in FIG. 7. As illustrated in FIG. 8, the well contact region 211 has a plurality of semiconductor regions 220 aligned in the second direction D2. The semiconductor region 220 is an impurity diffusion layer region. Each of the plurality of semiconductor regions 220 has a strip shape extending in the first direction D1.

Each of the plurality of semiconductor regions 220 is connected to a wiring 240 in a first wiring layer via a plurality of well contacts 230 aligned in the first direction D1. The heat dissipation is improved by providing a plurality of well contacts 230. The wiring 240 has a strip shape extending in the first direction D1. Further, as illustrated in FIG. 8, a wiring 250 is arranged in a second wiring layer above the first wiring layer, and the wiring 250 has a strip shape extending in the second direction D2 intersecting the first direction D1. The wiring 250 is connected to the wiring 240 through a via (not illustrated). The plurality of wirings 240 and the plurality of wirings 250 form a grid shape in a plan view. Thus, the heat dissipation is improved.

Although the plurality of well contacts 230 are arranged in the first direction D1 in FIG. 8, the arrangement direction is not particularly limited. The arrangement direction of the plurality of well contacts 230 may be, for example, the same as the arrangement direction of the well contacts in the circuit constituting the comparator 122.

Figure 9:
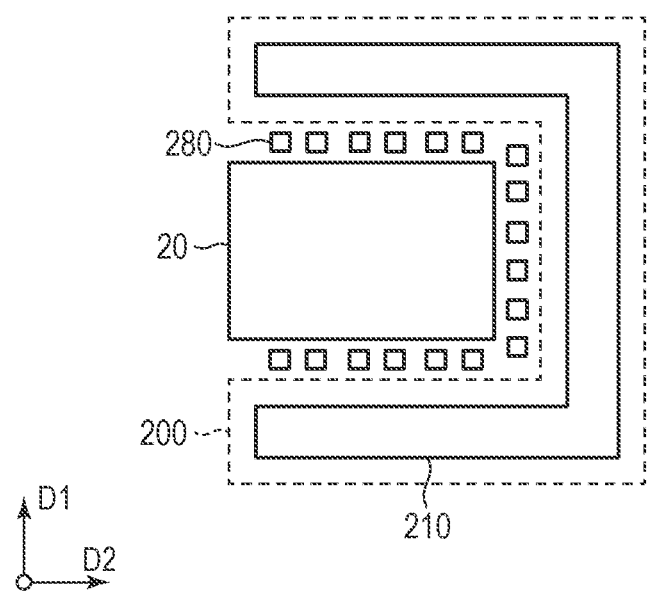
FIG. 9 is a schematic diagram illustrating a modification of the configuration around the reference signal generation circuit in the photoelectric conversion device according to the first embodiment.

FIG. 9 is a schematic diagram illustrating a modification of the configuration around the reference signal generation circuit 20 in the photoelectric conversion device according to the present embodiment. In this modified example, a plurality of dummy semiconductor regions 280 are arranged between the reference signal generation circuit 20 and the well region 200. The dummy semiconductor region 280 is an active region as a fill pattern between the reference signal generation circuit 20 and the well region 200. By arranging the fill pattern in this way, the manufacturing process can be stabilized.

Figure 10:
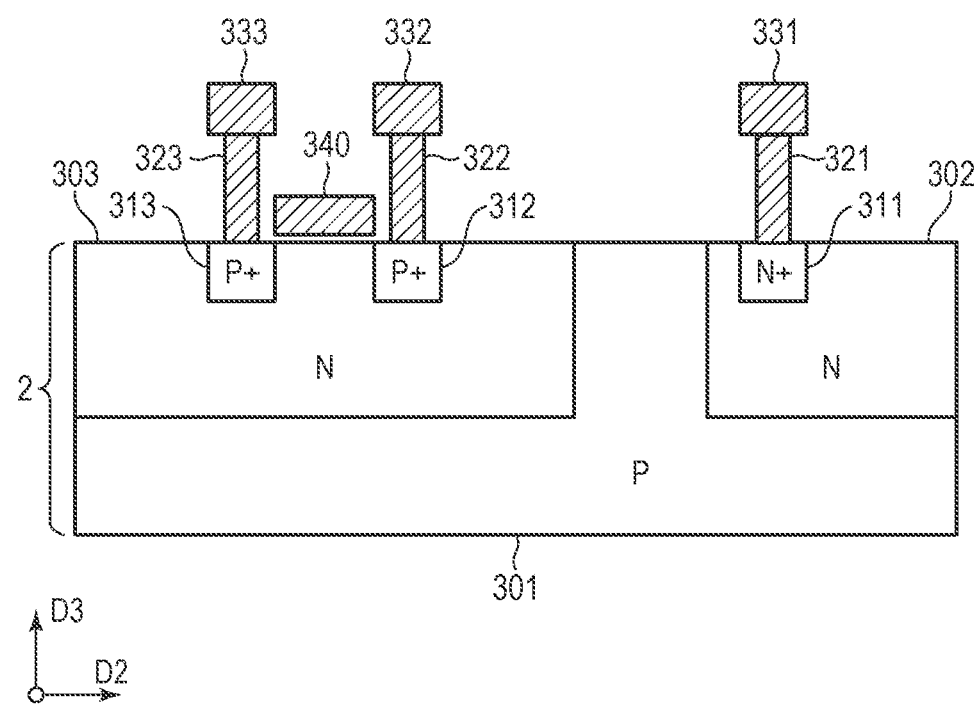
FIG. 10 is a schematic cross-sectional view illustrating a configuration around a reference signal generation circuit in the photoelectric conversion device according to the first embodiment.

FIG. 10 is a schematic sectional view illustrating the configuration of the periphery of the reference signal generation circuit 20 in the photoelectric conversion device according to the present embodiment. FIG. 10 illustrates an example of a cross section taken along line X-X' in FIG. 6. A third direction D3 illustrated in FIG. 10 is a direction perpendicular to a main surface of a substrate 2. The substrate 2 (first substrate) on which the photoelectric conversion device is formed has a P-type substrate region 301, N-type well regions 302 and 303, an N-type diffusion region 311, and P-type diffusion regions 312 and 313. A gate electrode 340, vias 321, 322, and 323, and wirings 331, 332, and 333 are arranged on the substrate 2. The wirings 331, 332, and 333 are wirings included in the first wiring layer. The gate electrode 340 is formed of polysilicon or the like.

A P-type MOS transistor including the N-type well region 303, the P-type diffusion regions 312 and 313, and the gate electrode 340 is one of transistors in the reference signal generation circuit 20. P-type diffusion regions 312 and 313, which are main electrodes (drain or source) of the P-type MOS transistor, are connected to wirings 332 and 333 through vias 322 and 323, respectively.

The N-type well region 302 corresponds to the well region 200 in FIG. 6. The via 321 corresponds to a well contact formed in the well contact region 210 in FIG. 6. A power supply potential is supplied to the well region 302 through the wiring 331, the via 321, and the N-type diffusion region 311 in this order.

In the photoelectric conversion device of the present embodiment, a well contact region 210 is arranged between the reference signal generation circuit 20 and a circuit element different from the reference signal generation circuit 20 in a plan view of a region functioning as a signal processing device for processing a signal output from the pixel. Thus, the influence of heat generation from the reference signal generation circuit 20 is reduced, and the quality of the output signal is improved. Therefore, the present embodiment provides a signal processing device capable of improving the quality of an output signal. Further, by using the signal processing device, a photoelectric conversion device capable of improving the quality of an output signal is provided.

Second Embodiment

Figure 11:
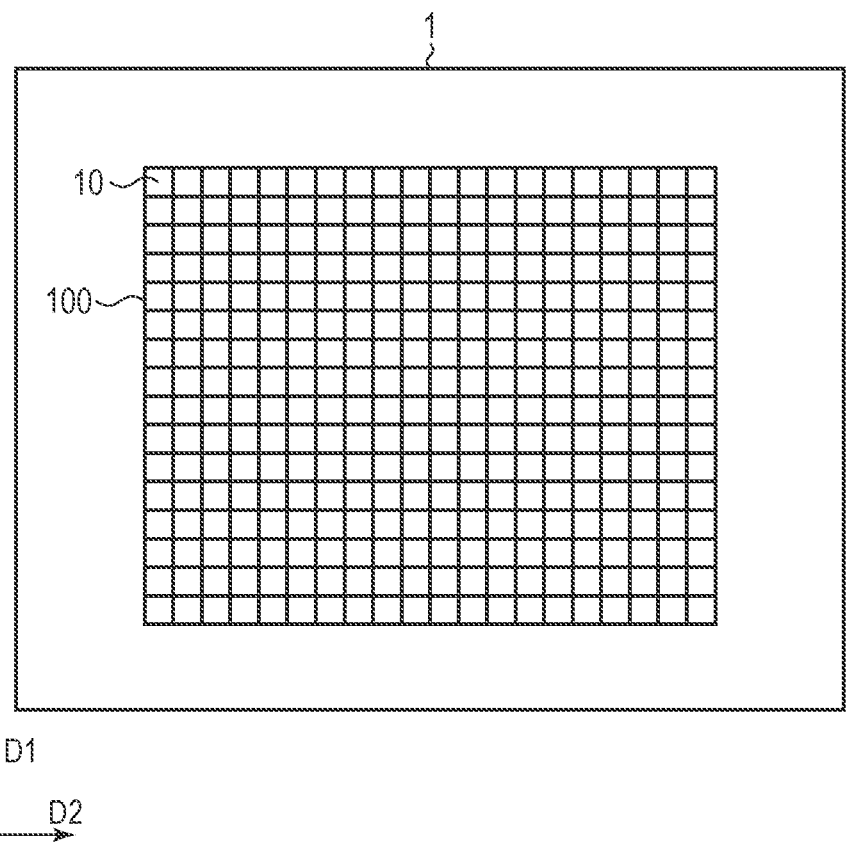
FIG. 11 is a schematic diagram of a photoelectric conversion device according to a second embodiment.
Figure 12:
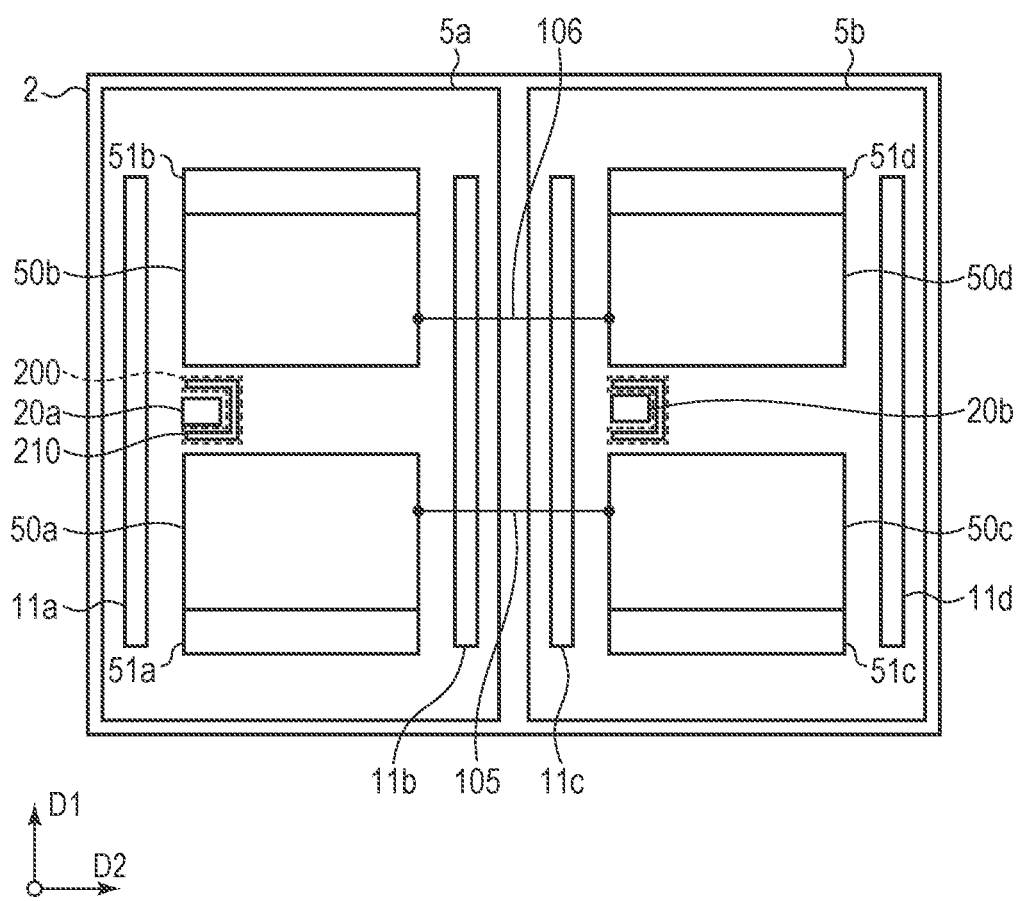
FIG. 12 is a schematic diagram of a photoelectric conversion device according to the second embodiment.

FIGS. 11 and 12 are schematic diagrams of the photoelectric conversion device according to the present embodiment. Hereinafter, the configuration different from the first embodiment will be mainly described.

The photoelectric conversion device in the present embodiment is a so-called back-illuminated type, and includes a substrate 1 (second substrate) and a substrate 2 (first substrate) for lamination. The substrate 1 and the substrate 2 may also be referred to as a pixel substrate and a circuit substrate, respectively. A pixel array 100 including a plurality of pixels 10 is formed on the substrate 1 and forming a plurality of rows and a plurality of columns. Further, control lines for driving the pixels 10 and signal lines for reading signals from the pixels 10 are arranged in the substrate 1.

The substrate 2 is stacked on the substrate 1. Two signal processing circuits 5a and 5b are formed in the substrate 2 side by side in the second direction D2. The signal processing circuits 5a and 5b may be configured to be substantially the same. Each of the signal processing circuits 5a and 5b of the substrate 2 may be formed by performing two exposures using a common mask set. The wiring (metal) layer above the two signal processing circuits 5a and 5b may be formed by simultaneous exposure. Thus, the wirings in the signal processing circuits 5a and 5b can be appropriately changed.

In the substrate 2, the signal processing circuit 5a includes AD conversion circuits (ADC) 50a and 50b, output circuits 51a and 51b, and row select circuits (vertical scanning circuits) 11a and 11b. Similarly, the signal processing circuit 5b includes AD conversion circuits 50c and 50d, output circuits Mc and Md, and row select circuits 11c and 11d. Each of the AD conversion circuits 50a to 50d may be provided corresponding to a predetermined region of the pixel array 100. For example, the AD conversion circuits 50a and 50c may correspond to the odd-numbered column signal lines 101a of the pixel array 100, and the AD conversion circuits 50b and 50d may correspond to the even-numbered column signal lines 101b (see FIG. 1).

The row select circuits 11a to 11d supply control signals to the pixel array 100 via the junction between the substrates 1 and 2, and drive the pixels 10 in a row basis. The row select circuits 11a and 11b are arranged on both sides of the AD conversion circuits 50a and 50b, and the row select circuits 11c and 11d are arranged on both sides of the AD conversion circuits 50c and 50d.

Each of the AD conversion circuits 50a to 50d includes a comparator, a counter, and a memory, and converts a pixel signal from the pixel 10 into a digital signal. The output circuits Ma to Md can perform digital signal processing such as digital gain, digital correlated double sampling, digital offset, and linearity correction on the digital signals from the AD conversion circuits 50a to 50d. Further, the output circuits Ma to 51d output the digital signal subjected to the signal processing to the outside of the photoelectric conversion device.

The signal processing circuits 5a and 5b are connected to each other by wiring groups 105 and 106. That is, the AD conversion circuit 50a and the AD conversion circuit 50c are connected to each other by the wiring group 105, and the AD conversion circuit 50b and the AD conversion circuit 50d are connected to each other by the wiring group 106. The wiring groups 105, 106 may include wirings for supplying reference signals.

A reference signal generation circuit 20a is arranged between the AD conversion circuit 50a and the AD conversion circuit 50b. The function of the reference signal generation circuit 20a is the same as that of the reference signal generation circuit 20 in the first embodiment. Also in the present embodiment, the well region 200 and the well contact region 210 are arranged so as to surround three sides of the reference signal generation circuit 20a in a plan view with respect to the substrate 2. That is, in a plan view with respect to the substrate 2, the well contact in the well contact region 210 is arranged between the reference signal generation circuit 20a and other circuit elements (the AD conversion circuits 50a and 50b).

A reference signal generation circuit 20b is arranged between the AD conversion circuit 50c and the AD conversion circuit 50d. The reference signal generation circuit 20b is a dummy circuit that does not perform an operation of generating a reference signal as will be described later, but has the same structure as the reference signal generation circuit 20a because it is formed by performing two exposures using a common mask set. A well region 200 and a well contact region 210 are arranged around the reference signal generation circuit 20b similarly to the reference signal generation circuit 20a. Depending on the manufacturing process, the reference signal generation circuit 20b, the well region 200, and the well contact region 210 may not be arranged.

FIG. 13 is a diagram for explaining the configuration of the signal processing circuit according to the present embodiment, and illustrates the AD conversion circuit 50a (first circuit area) and the AD conversion circuit 50c (second circuit area) in FIG. 12. Each of the AD conversion circuits 50a and 50c includes a current source 121, a comparator 122, a counter 16, a first memory 123, a second memory 124, and an output circuit 17. The current source 121, the comparator 122, the first memory 123, and the second memory 124 are provided for each column, and constitute a column circuit.

The plurality of comparators 122 in the AD conversion circuit 50a and the plurality of comparators 122 in the AD conversion circuit 50c are supplied with a common reference signal RAMP from one reference signal generation circuit 20a via the wiring group 105. Thus, the characteristic difference between the AD conversion circuit 50a and the AD conversion circuit 50c may be reduced. In this circuit configuration, the reference signal generation circuit 20b is not connected to the comparator 122 and is inoperative. Therefore, the reference signal generation circuit 20b does not generate heat due to power consumption.

Also in the present embodiment, the counter 16 supplies count signals to the plurality of first memories 123. In the plurality of AD conversion circuits 50a to 50d, the plurality of counters 16 may be configured to operate in synchronization with each other. For example, the start and stop of the operation of the plurality of counters 16 may be controlled by a common control signal, and the phases of the plurality of clock signals may be controlled to be synchronized with each other by a PLL circuit or the like.

A common bias voltage can be supplied to each of the plurality of current sources 121 in the AD conversion circuit 50a and the plurality of current sources 121 in the AD conversion circuit 50c. With such a configuration, it is possible to reduce the characteristic difference between the AD conversion circuits 50a and 50c.

Also in the present embodiment, the well contact region 210 is arranged between the reference signal generation circuit 20a and a circuit element different from the reference signal generation circuit 20a in a plan view of the substrate 2 which is a signal processing device for processing a signal output from the pixel. Thus, the influence of heat generation from the reference signal generation circuit 20a is reduced, and the quality of the output signal is improved. Therefore, the present embodiment provides a signal processing device capable of improving the quality of an output signal. Further, by using the signal processing device, a photoelectric conversion device capable of improving the quality of an output signal is provided.

In a configuration in which the substrate 1 is stacked on the substrate 2, the pixels 10 of the substrate 1 may be influenced by heat generation. For example, a shading component may occur in the dark current of the pixel 10 due to a thermal gradient in the pixel array 100. In contrast, in the present embodiment, since the influence of heat generated by the reference signal generation circuit 20a is reduced, the influence of heat received by the pixel 10 as described above can also be reduced.

Note that the influence of heat generated by the pixel 10 is great when the pixel 10 is arranged at a position overlapping the reference signal generation circuit 20a in a plan view. Therefore, the heat generation reduction effect according to the present embodiment becomes more significant when the pixel 10 overlaps the reference signal generation circuit 20a in a plan view. Further, by arranging the pixel 10 so as to overlap the reference signal generation circuit 20a in plan view, the area efficiency is increased and the chip cost can be reduced as compared with the case where the pixel 10 is arranged at a position shifted from the reference signal generation circuit 20a in a plan view.

In the present embodiment, a structure in which two substrates 1 and 2 are stacked is exemplified, but a structure in which three or more substrates are stacked may be used. In the present embodiment, two signal processing circuits 5a and 5b are arranged, but the number of signal processing circuits may be one or may be three or more.

Third Embodiment

Figure 14:
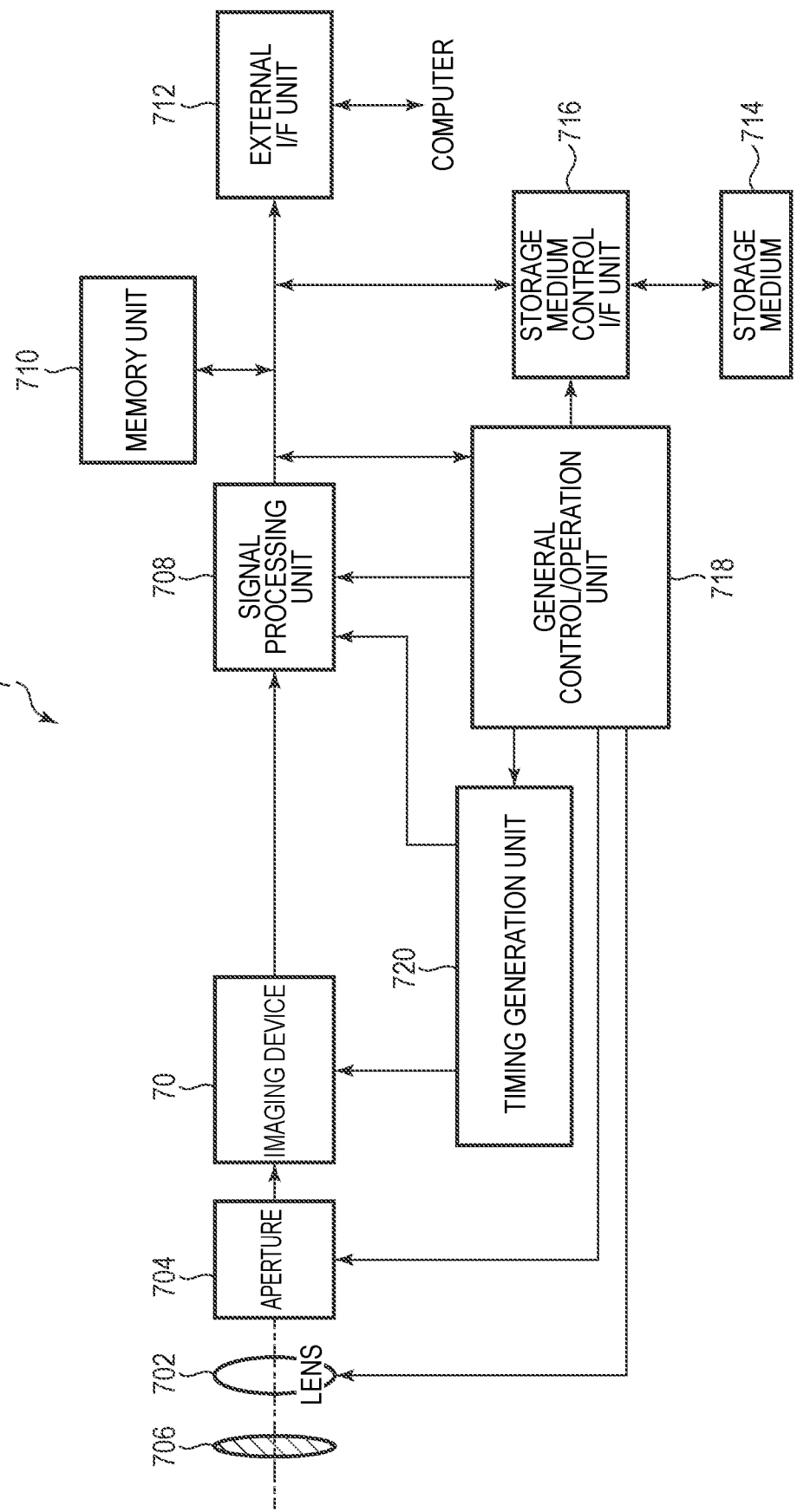
FIG. 14 is a block diagram of equipment according to a third embodiment.

The photoelectric conversion device in the above-described embodiments can be applied to various equipment. Examples of the equipment include a digital still camera, a digital camcorder, a camera head, a copier, a fax machine, a cellular phone, an in-vehicle camera, an observation satellite, and a surveillance camera. FIG. 14 is a block diagram of a digital still camera as an example of equipment.

Equipment 7 illustrated in FIG. 14 includes a barrier 706, a lens 702, an aperture 704, and an imaging device 70 (an example of a photoelectric conversion device). The equipment 7 further includes a signal processing unit (processing device) 708, a timing generation unit 720, a general control/operation unit 718 (control device), a memory unit 710 (storage device), a storage medium control I/F unit 716, a storage medium 714, and an external I/F unit 712. At least one of the barrier 706, the lens 702, and the aperture 704 is an optical device corresponding to the equipment. The barrier 706 protects the lens 702, and the lens 702 forms an optical image of the object on the imaging device 70. The aperture 704 varies the amount of light passing through the lens 702. The imaging device 70 is configured as in the above-described embodiment, and converts an optical image formed by the lens 702 into image data (image signal). The signal processing unit 708 performs various types of correction, data compression, and the like on the imaging data output from the imaging device 70. The timing generation unit 720 outputs various timing signals to the imaging device 70 and the signal processing unit 708. The general control/operation unit 718 controls the overall digital still camera, and the memory unit 710 temporarily stores image data. The storage medium control I/F unit 716 is an interface for storage or reading of image data in or from the storage medium 714, and the storage medium 714 is a removable storage medium such as a semiconductor memory for storage or reading of imaging data. The external I/F unit 712 is an interface for communicating with an external computer or the like. The timing signal or the like may be input from the outside of the equipment. Further, the equipment 7 may include a display device (a monitor, an electronic view finder, or the like) for displaying information obtained by the photoelectric conversion device. The equipment includes at least the photoelectric conversion device. Further, the equipment 7 includes at least one of the optical device, the control device, the processing device, the display device, the storage device, and a mechanical device that operates based on information obtained by the photoelectric conversion device. The mechanical device is a movable unit (for example, a robot arm) that operates in response to a signal from the photoelectric conversion device.

Each pixel may include a plurality of photoelectric conversion units (a first photoelectric conversion unit and a second photoelectric conversion unit). The signal processing unit 708 may be configured to process the pixel signal based on the charge generated in the first photoelectric conversion unit and the pixel signal based on the charge generated in the second photoelectric conversion unit, and acquire the distance information from the imaging device 70 to the object.

Fourth Embodiment

Figure 15A:
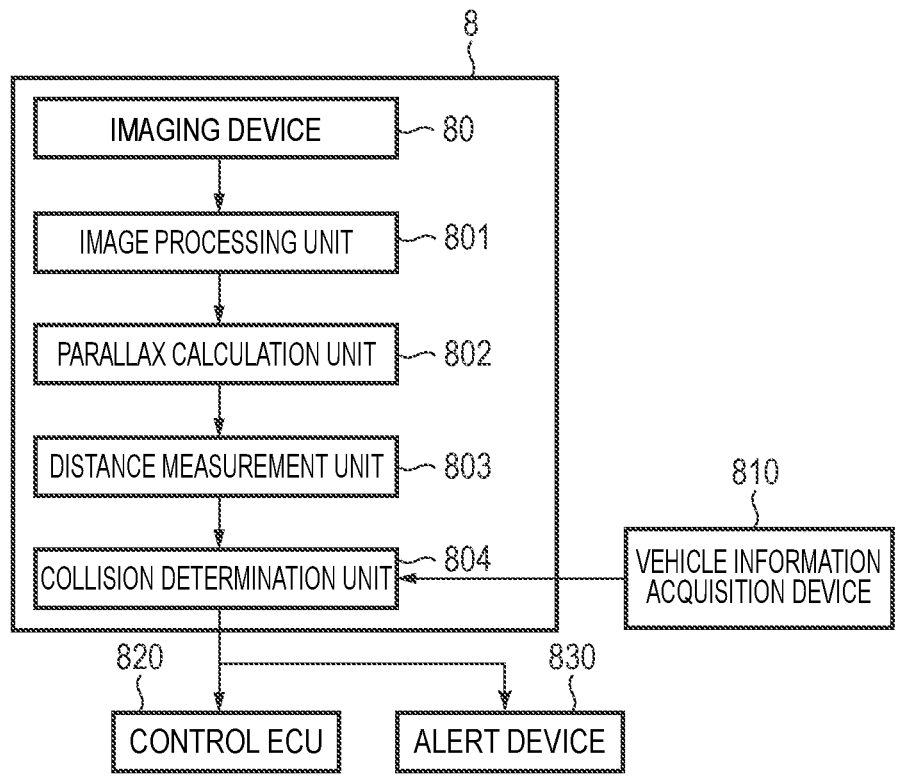
FIGS. 15A and 15B are block diagrams of equipment according to a fourth embodiment.
Figure 15B:
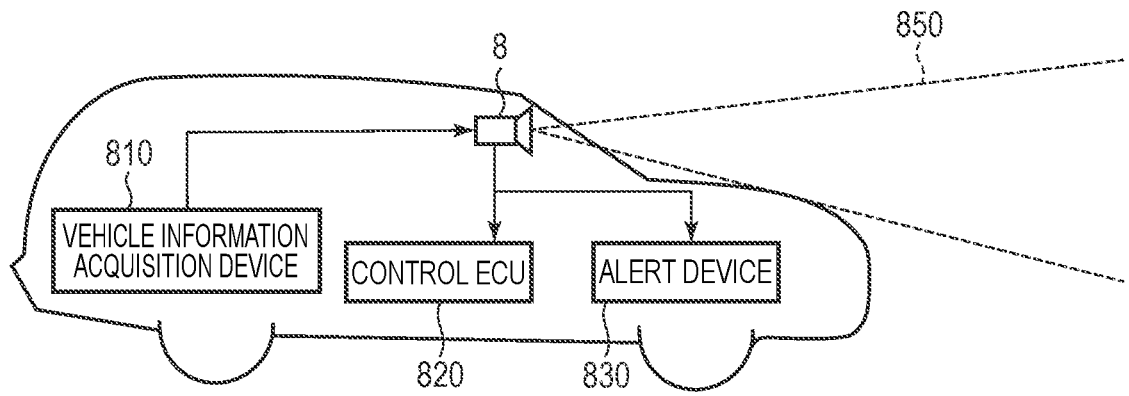

FIGS. 15A and 15B are block diagrams of equipment related to an in-vehicle camera according to the present embodiment. Equipment 8 includes an imaging device 80 (an example of a photoelectric conversion device) according to the above-described embodiment, and a signal processing device (processing device) that processes a signal from the imaging device 80. The equipment 8 includes an image processing unit 801 that performs image processing on a plurality of image data acquired by the imaging device 80, and a parallax calculation unit 802 that calculates parallax (phase difference of parallax images) from the plurality of image data acquired by the equipment 8. Further, the equipment 8 includes a distance measurement unit 803 that calculates a distance to an object based on the calculated parallax, and a collision determination unit 804 that determines whether there is a possibility of collision based on the calculated distance. Here, the parallax calculation unit 802 and the distance measurement unit 803 are an example of a distance information acquisition means that acquires distance information to an object. That is, the distance information is information related to parallax, defocus amount, distance to the object, and the like. The collision determination unit 804 may determine the possibility of collision using any of the distance information. The distance information acquisition means may be realized by hardware designed dedicatedly, or may be realized by a software module. It may be realized by a field programmable gate array (FPGA), an application specific integrated circuit (ASIC) or a combination thereof.

The equipment 8 is connected to a vehicle information acquisition device 810, and can acquire vehicle information such as a vehicle speed, a yaw rate, and a steering angle. A control ECU 820, which is a control device that outputs a control signal for generating braking force to the vehicle based on the determination result of the collision determination unit 804, is connected to the equipment 8. The equipment 8 is also connected to an alert device 830 that issues an alert to the driver based on the determination result of the collision determination unit 804. For example, when the possibility of collision is high as the determination result of the collision determination unit 804, the control ECU 820 performs vehicle control for avoiding collision or reducing damage by applying a brake, returning an accelerator, suppressing engine output, or the like. The alert device 830 alerts a user by sounding an alert such as a sound, displaying alert information on a screen of a car navigation system or the like, and providing vibration to a seatbelt or steering wheel. The equipment 8 functions as a control means for controlling the operation of controlling the vehicle as described above.

In the present embodiment, an image of the periphery of the vehicle, for example, the front or the rear is captured by the equipment 8. FIG. 15B illustrates equipment when capturing an image of the front of the vehicle (capturing area 850). The vehicle information acquisition device 810 serving as an imaging control means sends an instruction to the equipment 8 or the imaging device 80 to perform an imaging operation. With such a configuration, the accuracy of distance measurement can be further improved.

Although an example in which the vehicle is controlled so as not to collide with another vehicle has been described above, the embodiment is also applicable to control to automatic driving control for following another vehicle, automatic driving control for not going out of a traffic lane, or the like. Furthermore, the equipment is not limited to a vehicle such as an automobile and can be applied to a movable body (movable apparatus) such as a ship, an airplane, a satellite, an industrial robot and a consumer use robot, or the like, for example. In addition, the equipment can be widely applied to equipment which utilizes object recognition or biometric authentication, such as an intelligent transportation system (ITS), a surveillance system, or the like without being limited to movable bodies.

Modified Embodiments

The present invention is not limited to the above-described embodiments, and various modifications are possible. For example, an example in which a configuration of a part of any embodiment is added to another embodiment or an example in which a configuration of a part of any embodiment is substituted replaced with another embodiment is also an embodiment of the present invention.

In the above embodiments, the configuration of the photoelectric conversion device is not limited to that described in the above embodiments. For example, the capacitance of the floating diffusion FD may be variable. This configuration can be realized, for example, by adding a variable capacitor, a capacitor capable of switching connection by a switch, and the like. Alternatively, a plurality of column signal lines may be arranged in one column of the pixel array 100, and the column signal lines for outputting signals may be switched by arranging a plurality of select transistors in one pixel. A capacitor and a switch for holding an analog signal at the time of resetting the pixel 10 may be further connected to the comparator 122. In this case, the comparator 122 can perform an auto-zero operation.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-062604, filed Apr. 1, 2021, which is hereby incorporated by reference herein in its entirety.

What is claimed is:

1. A signal processing device comprising:
a first substrate;
a signal generation circuit arranged in the first substrate and configured to generate a reference signal to be used for comparison with a signal output from a pixel;
a circuit element arranged in the first substrate and different from the signal generation circuit;
a first semiconductor region arranged in the first substrate;
a plurality of first wirings each of which extends along a first direction;
a plurality of second wirings each of which extends along a second direction which intersects the first direction; and
a contact region in which a plurality of contacts are arranged,
wherein one of the plurality of second wirings is connected to the plurality of first wirings,
wherein in a plan view with respect to the first substrate, the contact region is arranged between the signal generation circuit and the circuit element, and
wherein a bottom of each of the plurality of contacts is in contact with the first semiconductor region, and a top of each of the plurality of contacts is in contact with a first wiring of the plurality of first wirings.

2. The signal processing device according to claim 1, wherein the circuit element includes a comparator configured to compare a signal output from the pixel with the reference signal.

3. The signal processing device according to claim 1, wherein the circuit element includes a counter configured to output a digital signal corresponding to time.

4. The signal processing device according to claim 1, wherein the circuit element includes a bias circuit for a current source configured to supply a driving current for outputting a signal from the pixel.

5. The signal processing device according to claim 1, wherein each of the plurality of contacts connects a well arranged in the first substrate and a wiring to which a power supply potential is supplied.

6. The signal processing device according to claim 1, wherein a thermal conductivity of the contact is higher than a thermal conductivity of the first substrate.

7. The signal processing device according to claim 1, wherein a plurality of the contact regions are arranged with a gap therebetween.

8. The signal processing device according to claim 1, wherein the contact region includes the plurality of the contacts arranged side by side in the first direction.

9. The signal processing device according to claim 1, wherein in the plan view, a first wiring layer includes the plurality of first wirings and a second wiring layer includes the plurality of second wirings, the first wiring layer is arranged between the second wiring layer and the first substrate.

10. The signal processing device according to claim 1 further comprising, in the plan view, a dummy semiconductor region arranged between the contact region and the signal generation circuit.

11. A photoelectric conversion device comprising:
the signal processing device according to claim 1; and
the pixel.

12. The photoelectric conversion device according to claim 11 further comprising a second substrate stacked on the first substrate,
wherein the pixel is arranged in the second substrate.

13. The photoelectric conversion device according to claim 12, wherein the signal generation circuit is arranged at a position overlapping the pixel in the plan view.

14. An equipment comprising:
the photoelectric conversion device according to claim 11; and
at least any one of:
an optical device adapted for the photoelectric conversion device,
a control device configured to control the photoelectric conversion device,
a processing device configured to process a signal output from the photoelectric conversion device,
a display device configured to display information obtained by the photoelectric conversion device,
a storage device configured to store information obtained by the photoelectric conversion device, and
a mechanical device configured to operate based on information obtained by the photoelectric conversion device.

15. The equipment according to claim 14, wherein the processing device processes image signals generated by a plurality of photoelectric conversion units, respectively, and acquires distance information on a distance from the photoelectric conversion device to an object.

16. The signal processing device according to claim 1,
wherein another signal generation circuit is further arranged in the first substrate, and
wherein the another signal generation circuit does not generate the reference signal.

17. The signal processing device according to claim 1,
wherein the first semiconductor region is arranged in a main face of the first substrate,
wherein the signal generation circuit includes a transistor, and
wherein the transistor has a second semiconductor region arranged on the main face.

18. The signal processing device according to claim 17, wherein another contact having a bottom in contact with the second semiconductor region is further arranged in the contact region.

19. The signal processing device according to claim 1, wherein the plurality of contacts are arranged along the first direction.

20. The signal processing device according to claim 1, wherein the top of each of the plurality of contacts is in contact with corresponding first wiring of the plurality of first wirings.

21. The signal processing device according to claim 1, wherein a grid pattern is formed by the plurality of first wirings and the plurality of second wirings.

22. The signal processing device according to claim 19, wherein a grid pattern is formed by the plurality of first wirings and the plurality of second wirings.

23. The signal processing device according to claim 20, wherein a grid pattern is formed by the plurality of first wirings and the plurality of second wirings.

* * * * *